United States Patent
Schuette et al.

(10) Patent No.: US 8,694,754 B2
(45) Date of Patent: Apr. 8, 2014

(54) NON-VOLATILE MEMORY-BASED MASS STORAGE DEVICES AND METHODS FOR WRITING DATA THERETO

(75) Inventors: Franz Michael Schuette, Colorado Springs, CO (US); William Ward Clawson, Hollister, CA (US)

(73) Assignee: OCZ Technology Group, Inc., San Jose, CA (US)

( * ) Notice: Subject to any disclaimer, the term of this patent is extended or adjusted under 35 U.S.C. 154(b) by 288 days.

(21) Appl. No.: 13/251,491

(22) Filed: Oct. 3, 2011

(65) Prior Publication Data

US 2013/0067138 A1    Mar. 14, 2013

Related U.S. Application Data

(60) Provisional application No. 61/532,680, filed on Sep. 9, 2011.

(51) Int. Cl.
*G06F 12/00* (2006.01)
*G11C 16/10* (2006.01)

(52) U.S. Cl.
USPC .... 711/202; 711/103; 711/108; 711/E12.008; 711/E12.058

(58) Field of Classification Search
None
See application file for complete search history.

(56) References Cited

U.S. PATENT DOCUMENTS

| | | | |
|---|---|---|---|
| 6,295,619 B1 * | 9/2001 | Hasbun et al. | 711/162 |
| 8,065,469 B2 * | 11/2011 | Mothilal | 711/103 |
| 2002/0075728 A1 * | 6/2002 | Mokhlesi | 365/185.33 |
| 2004/0034765 A1 * | 2/2004 | James | 713/1 |
| 2007/0300009 A1 * | 12/2007 | Rogers et al. | 711/103 |
| 2008/0133824 A1 * | 6/2008 | Kim | 711/103 |
| 2008/0301256 A1 * | 12/2008 | McWilliams et al. | 714/758 |
| 2009/0037652 A1 * | 2/2009 | Yu et al. | 711/103 |
| 2009/0300465 A1 * | 12/2009 | Wu et al. | 711/102 |
| 2011/0199825 A1 * | 8/2011 | Han et al. | 365/185.11 |
| 2012/0011340 A1 * | 1/2012 | Flynn et al. | 711/171 |
| 2012/0079174 A1 * | 3/2012 | Nellans et al. | 711/103 |
| 2012/0216085 A1 * | 8/2012 | Weingarten et al. | 714/718 |
| 2012/0239976 A1 * | 9/2012 | Cometti et al. | 714/24 |
| 2012/0284587 A1 * | 11/2012 | Yu et al. | 711/103 |
| 2013/0191700 A1 * | 7/2013 | Griffin et al. | 714/759 |

OTHER PUBLICATIONS

Chen et al. "CAFTL: A Content-Aware Flash Translation Layer Enhancing the Lifespan of Flash Memory based Solid State Drives." Proceedings, 9th USENIX Conf. on File and Storage Tech. [FAST'11]. San Jose, Calif., Feb. 15-17, 2011.*

* cited by examiner

*Primary Examiner* — Matthew Bradley
*Assistant Examiner* — Daniel Bernard
(74) *Attorney, Agent, or Firm* — Hartman Global IP Law; Gary M. Hartman; Domenica N. S. Hartman (57) ABSTRACT

A non-volatile solid state memory-based mass storage device having at least one non-volatile memory component and methods of operating the storage device. In one aspect of the invention, the one or more memory components define a memory space partitioned into user memory and over-provisioning pools based on a P/E cycle count stored in a block information record. The storage device transfers the P/E cycle count of erased blocks to a host and the host stores the P/E cycle count in a content addressable memory. During a host write to the storage device, the host issues a low P/E cycle count number as a primary address to the content addressable memory, which returns available block addresses of blocks within the over-provisioning pool as a first dimension in a multidimensional address space. Changed files are preferably updated in append mode and the previous version can be maintained for version control.

14 Claims, 8 Drawing Sheets

NON-VOLATILE MEMORY-BASED MASS STORAGE DEVICES AND METHODS FOR WRITING DATA THERETO

CROSS REFERENCE TO RELATED APPLICATIONS

This application claims the benefit of U.S. Provisional Application No. 61/532,680, filed Sep. 9, 2011, the contents of which are incorporated herein by reference.

BACKGROUND OF THE INVENTION

The present invention generally relates to memory devices used with computers and other processing apparatuses, and more particularly to mass storage devices that use non-volatile (permanent) based memory components for permanent storage of data.

All current operating systems for personal computers and servers were co-developed with hard disk drive (HDDs) as the prevalent storage medium. Hardly anything better reflects the fact that disk drives are at the core of the operating system than the acronym MS-DOS, short for Microsoft Disk Operating System. Even though MS-DOS is by today's standards only a niche product, its legacy has ramified into all existing Microsoft operating systems with the side effect that the file system at the core is centers on the special needs and strengths of rotatable storage media used in electromechanical disk drives.

A. Hard Disk Drives Vs. Solid State Drives

Hard disk drives are electro-mechanical devices with a single channel to access the internal media, whereas solid state drives (SSDs) have only electronics as functional units and access the media over multiple parallel channels. The key differences between HDDs and SSDs are probably best summarized by the following characteristics:

|  | HDD | NAND Flash-based SSD |
| --- | --- | --- |
| Cost per Byte | Extremely low cost per byte | Moderate cost per byte |
| Access Latency | High access latencies | Low access latencies |
| Power Envelope | High power consumption | Low power consumption |
| Optimal Data Structure | Optimized for sequential transfers | Sequential or random IOs |
| Data R/W access mode | Single channel/single thread | Multi-channel, independent parallel threads |
| Overwriting of existing data | Direct overwriting of existing data | No direct overwriting of existing data possible |
| Data Retention | Unlimited data retention | Limited data retention |
| Mechanical Stability | Sensitive to mechanical shock, vibration, humidity, temperature | Insensitive to mechanical shock, vibration and humidity, minor sensitivity to temperature |

Cost per byte, data retention, power considerations and mechanical stability are parameters that primarily play into the market acceptance and purchasing decision for new and additional storage media. At the same time, access latency can be directly tied to overall storage subsystem performance. For the following considerations, the just mentioned characteristics are of only ancillary importance, therefore, this following will specifically focus on how data are stored in traditional HDDs as opposed to SSDs and elaborate on the shortcomings of existing file or disk operating systems.

B. Concurrent Evolution of Hard Disk Drives and File Systems

Hard disk drives store data on rotatable platters divided into sectors that are moving under a read/write head. The read/write head is mounted on an actuator which in turn moves the head across the different tracks from outer to inner diameter of the platters. Track density is constantly increasing, requiring higher precision positioning of the head over the track with every generation of drive. This is achieved through embedded positional signals in the form of servo tracks interspersed with the data sectors. However, because of the required positional precision, it is not practical to read simultaneously from two heads, for the simple reason that even small temperature gradients in the actuator assembly could cause skewing of one head relative to the other, causing one of the heads to miss its target track.

Consequently, at any given time, transfer to or from the media is limited to a single bit-stream transferred via a single head. During a read access, the bit-stream is converted by the internal logic into an 8 bit/10 bit encrypted host data stream that is then decoded on the system level into the actual bytes requested by the host. Writing data to the storage device reverses the process, that is, a command—address—data package is sent from the host to the drive via the writeFirstPartyDMA command, after which the data are 8 bit/10 bit encoded and written to physical sectors on the rotating platters. File updates are preferentially done by overwriting the entire file to the same sectors used by the original file. The entire file system is sector based wherein each sector corresponds to a logical block address (LBA) hard encoded on the platters. In the case of File Allocation Table (FAT)-based file systems, the minimum data structure is established by equally dividing the entire LBA space by the number of available address bits (for example FAT-32), whereas in Windows NT File System (NTFS), a fixed cluster size is used by the file system (typically 4 kBytes corresponding to 8 sectors of 512 Bytes).

C. Physical Contiguity of Files as Prerequisite for Performance of Rotatable Media Hard disk drive performance strongly depends on the physical location of data or sectors with respect to contiguousness and eccentricity. Any interruption in the sequence of LBAs will cause significant seek and rotational latencies, moreover, transfer rates depend on the linear speed of the media under the read/write head, therefore tracks at the outer diameter will have much higher sequential transfer rates than tracks at the inner diameter. Any HDD will show the highest performance if contiguous data structures are established either during the initial write process or through defragmentation and if that contiguity is maintained even if the files are modified. A simplified way of describing this mode of operation of a hard disk drive is the term read-modify-write, that is, data are read from the media, modified by the host and then written back-preferentially to the same LBA and using additional LBAs as overflow only if the file size increases over the previous version. In case that the newer version of the file is smaller than the original, a gap consisting of invalid data is created at the end of the file and will typically persist until the drive is defragmented.

Hard disk drives and their specific capabilities and limitations have been crucial elements in the evolution of operating systems. It is not surprising, therefore, that it has been mandatory to optimize file systems to preserve any physical coherency of data as the heart of maintaining disk performance. Moreover, since only a single bit stream can be committed to the media at any time, the host system—at least in the case of ATA, will refrain from sending parallel requests or mix and match batches of different files simultaneously.

Regardless of the shortcomings of HDD technology, one of the strong points is their essentially unlimited data retention. Barring any mechanical or logic failure of the drive, data committed to the media are permanent at least within the time scale used for digital storage. Data retention is independent of the drive being powered up or offline since no refresh cycles are necessary to counteract leakage resulting in bit rot.

D. Solid State Media

Unlike conventional HDDs, solid state media are not relying on a single head to commit data to storage, rather, solid state storage media typically write data in a highly parallel fashion to the memory devices. The broadest interpretation of the term solid state memory circumscribes any type of IC-based memory technology but, based on the cost per bit and overall distribution, only NAND flash memory is relevant for the current storage landscape.

E. Strength and Limitations of NAND-Flash Media

NAND flash memory is a compromise between cost per bit, speed, data retention and write endurance, with some of the parameters being on opposite ends of the spectrum. In the context of re-writable mass storage, the biggest functional differences between NAND flash memory and HDD platters are the greatly reduced access latencies, the parallel data paths and, last but not least, the fact that NAND flash memory cannot be simply overwritten with new data. NAND flash memory cells are made up from floating gate transistors that can be programmed only in a unidirectional manner. Moreover, in order to simplify the design of NAND flash memory and also to avoid artifacts stemming from the electrical fields associated with Fowler-Nordheim quantum mechanical tunneling, erase processes have to be carried out on a per-block basis. As a consequence, every page of NAND flash memory needs to be pre-erased before the individual cells can be programmed.

F. Append Vs. Overwrite

The requirement of NAND flash to pre-erase blocks before they can be re-programmed precludes the use of the simple "read-modify-write" scheme discussed above in the context of HDDs. Instead, NAND flash based solid state drives have to operate strictly in "append" mode, meaning that data are written to virgin pages as long as those are available. Because no mechanical parts are involved, the actual locality of the data is largely inconsequential, even though it is advantageous to distribute logically coherent data such that all available channels can be used to access them in a parallel fashion. In analogy to the read-modify-write scheme used by HDDs, an adequate term would be read-modify-append, followed by an invalidate and finally an erase operation for the original location.

Once the drive runs out of virgin pages, data have to be moved around, consolidated in order to free up entire blocks which are then erased, before the blocks can be cycled into the next write access. One fact to be taken into account in this regard is that consolidation of data does not mean physical coalescing of logically coherent data as in the case of defragmentation of HDDs. On the contrary, similar as in the case of a write access, in order to optimize recurrent read transfers, it is advantageous to maintain distribution of logically coherent data over as many independent channels as possible. The file translation layer provides the logical to physical block mapping.

G. Data Retention, Refresh and Remap

A second, yet important difference between HDDs and flash memory in any of its iterations is the limited data retention of flash because of either leakage current or from read-disturb effects as described in more detail below. Flash memory stores data in the form of charges in the floating gate of the floating gate transistor but eventually those charges will dissipate through the oxide layer into the substrate, resulting in bit rot. This process typically takes anywhere from 1 to several years but, especially in the case of archived data, leakage currents leading to bit rot still become an important factor.

Read-disturb refers to a different phenomenon; that is, because of the specific architecture of NAND flash, a read access of a single page requires the biasing of all pages in the same block via the word lines to typically 5 V. Over time, the cumulative electrical fields applied through the word lines will have a similar effect as programming charges that are applied through the very same word lines to the control gates. The result can be creeping charge of the floating gate which alters the bit values of the NAND flash cells and which is also known as read-disturb. Arguably, read-disturb takes thousands of read accesses to the same block before any noticeable effect occurs. However, at least in the case of MLC NAND flash with 256 pages per block it only requires a limited number of sequential scrolls through all pages to hit the threshold at which programming charge shifts result in increased number of bit errors.

Any modern SSD will take countermeasures against both leakage current and read-disturb through measuring the bit error rate on read accesses, which can be determined by comparing the actual data against the corrected version based on the implemented ECC algorithms. If the bit error rate increases, the data are refreshed or rather re-written, yet this rewriting entails moving the data to a different block on the same NAND device or moving the data to a different channel altogether. The result is a dynamic, constant change of logical to physical address mapping. Even though this type of mapping is done on the level of the flash translation layer and is transparent to the host, it requires more sophisticated metadata that need to be able to track the different mapping units as well as their status with respect to being valid data or having been invalidated for the file system in order to schedule the pages or block for garbage collection and TRIM-based erasing.

H. File System Challenges

As discussed above, currently prevailing operating systems have evolved on the legacy of disk operating systems, regardless of whether it is any Microsoft, Unix or Linux-based OS. Historically, the single bit-stream of HDDs matched the requirements of a single core processor since at any given time only a single thread was being processed. This situation has dramatically changed with the introduction of multi-core processors and also thread level parallelism using Intel's HyperThreading. Multiple data streams are processed in parallel and eventually, all data need to be written to the drive. On the system level, this can be accomplished by queuing up requests to serially transfer data from the host to the drive using the same strategies as what has been used for decades in HDD technology. On the level of the drive, native command queuing streamlines the workload through intelligent re-ordering and scheduling of the different workloads to minimize mechanical movement and wear of the drive. Data are updated using an "in place" strategy, that is, by using the above discussed read-modify-write method to preserve as much as possible contiguous physical data structures.

In combination with the transition from a parallel ATA to a serial ATA host interface, these measures have greatly improved the way data are moved between the host and the storage devices, resulting in an adequate match between the OS handling data through the file system and existing HDD technology. However, current file systems hardly take advantage of the capabilities of solid state drives.

The currently used method of interfacing NAND flash with the operating system simply employs a standard SATA interface and uses NAND flash ICs at the back-end. The standard SATA protocol interfaces the drive with the system and the drive then uses the flash translation layer to map logical to physical block addresses. Native command queuing is adapted to fill the parallel NAND channels. However, NAND flash does not allow "in place" updates, rather, all updates need to be written to a new location, whereupon the metadata are changed to reflect the new physical data structure. For maximum efficiency, physical contiguity of the data structures needs to be disrupted and the individual file fragments need to be distributed over as many channels as possible in order to allow the fastest possible parallel load/store accesses.

While the currently used adaptation of the disk-based file systems for NAND flash is a reasonable compromise, it is clear that better file systems are needed to take advantage of the special features of NAND flash or other solid state memory media.

BRIEF DESCRIPTION OF THE INVENTION

The current invention provides non-volatile solid state memory-based mass storage devices, for example, NAND flash-based mass storage devices, and methods performed with computer systems to store data on such mass storage devices.

According to a first aspect of the invention, a computer system comprising a host is adapted to store data in a non-volatile solid state memory-based mass storage device. The mass storage device has a substrate and at least one non-volatile memory component mounted thereon, and memory locations in the non-volatile memory component having first order addresses and second order addresses. The method includes generating with the non-volatile memory component a record of the number of programming cycles relating to the first order address, transmitting the record to the host, and then selecting with the host a low number of programming cycles within a range of numbers of programming cycles of records relating to the first order addresses as an initial address for a write access to the non-volatile memory device.

The method described above preferably uses a log-structured file system based on a virtual address space managed by a logical-to-physical mapping unit, referred to as flash translation layer. Writes to a non-volatile solid state memory-based mass storage device use append-only policies instead of overwrite. Every block in the memory components of the mass storage device contains a block information record (BIR) of the erase count of the block as well as the status of the block as valid, erased, obsolete or mixed.

The above discussed append mode of storage is possible if the memory space is not completely filled up. In other words, a prerequisite for append mode is the availability of free or unused blocks, which can be provided by partitioning the memory space into a user accessible pool and a pool of spare blocks, for example, an over-provisioning (OP) pool which will always contain un-used blocks. Blocks are dynamically assigned to either pool from where they can be cycled in and out. Data are always written to the OP pool and as soon as a block is full it will be cycled into the user memory whereupon a free block is virtually assigned to the OP pool in order to replenish it. The BIR may contain information regarding the assignment of a block to the user memory or the OP-pool.

An erase cycle count of each block can be copied into a content addressable memory on the system level to serve as the first dimension in a multi-dimensional address space, which can further comprise chip enable, block, page and byte addresses of blocks virtually assigned to the OP-pool. According to one aspect of the invention, the program/erase (P/E) cycle count of all blocks in the storage device is monitored internally and only blocks with a low P/E count are assigned to the OP-pool. Accordingly a P/E count threshold that is updated after each write cycle can be set in order to select blocks within the OP-pool. The storage device may use a volatile memory buffer that preserves the address associated with the data for transient buffering of writes. Also, the operating system can make the P/E count visible to the user in form of numerical values or a P/E cycle histogram for the device. Alternatively the P/E range of the OP-pool may be only displayed as a representative sample. The host may also store a copy of the P/E count history for detailed analysis of all activities of the drive during its service time.

After re-writing a file in append mode to one of the OP-pool blocks, the assignment of the blocks can be changed to the user memory pool and the log for the file or the metadata can be changed to reflect the new physical location of the file. The original file can be maintained as part of a version-control policy wherein the number of levels may be user-specified or be controlled by a time-out definition. If a file is rewritten, the file system is aware of the changes of the original file and may only write the portions of the file that have actually changed and then cross-links the physical file fragments to a logically contiguous data structure in the form of a multi-dimensional matrix distributed over channels, chips, blocks and pages.

Partially written blocks can be consolidated by filling up first blocks with the highest page number in use, first with valid data from partially-written second blocks during garbage collection and then updating the log accordingly to reflect the new physical location of the valid data in the first blocks while invalidating the original pages on the second blocks. If the second blocks no longer contain pages with valid data, they can be scheduled for bulk erase and, on demand, cycled into the over-provisioning pool.

One aspect of the invention further configures blocks to be moved into the OP-pool to work in single-level cell mode, that is, only one bit is stored per cell. This allows fast and reliable host writes to the blocks. Once the cell is written to and moved into the user memory pool, the second set of logical pages corresponding to multi-level cell functionality is enabled. Alternatively, blocks can be reconfigured after an erase cycle to assign either single level cell (SLC) mode to allow for host writes or to assign multi-level cell (MLC) mode for the purpose of garbage collection and data coalescence.

Another aspect of the invention allows for dynamic change of the mapping unit size concomitant with an erase cycle or as a block formatting after the erase cycle. Preferred sizes are 4 kB and 8 kB mapping unit size, corresponding to the majority of host writes.

Yet another aspect of the invention allows files to be treated as objects, which can then be indexed as either simple objects stored in a single mapping unit or composite objects stored in a plurality of mapping units. Updates of files may append only the portions that were changed to a new location and optionally maintain the previous data as version control.

In certain embodiments, the file system of the invention is used with a NAND flash-based mass storage device having a conventional Serial-ATA or comparable interface. In certain other embodiments, the file system of the invention interfaces with a NAND flash-based mass storage device through a high-speed unified interface of parallel PCIe lanes. Preferably, the mass storage device is exposed directly to the system via a parallel interface that can be accessed by multiple threads simultaneously. A multi-ported flash translation layer acts as the functional equivalent of a crossbar switch. Another alternative is to partition the memory space of the mass storage device into at least two domains that are accessed by discrete channels. Each channel can be addressable on the system level by at least several threads.

While the different aspects of the method are described for discrete drives and host, they can also be implemented on a more integrated storage device with higher built-in intelligence, such as an embedded file-server, wherein the device itself may contain the file system and is functionally equivalent to a sub-host.

Other objects and advantages of this invention will be better appreciated from the following detailed description.

DETAILED DESCRIPTION OF THE INVENTION

The current invention provides non-volatile solid state memory-based mass storage devices, for example, NAND flash-based mass storage devices, typically in the form of solid-state drives (SSDs), and methods of storing data on such SSDs. Furthermore, the invention provides a multi-dimensional log-structured file management system for SSDs using an optional multi-channel or parallel system interface. Various aspects of the invention will be described under sub-headers, which are provided for the purpose of organization and do not necessarily limit the scope of the invention.

A. Physical Implementation

Figure 1:
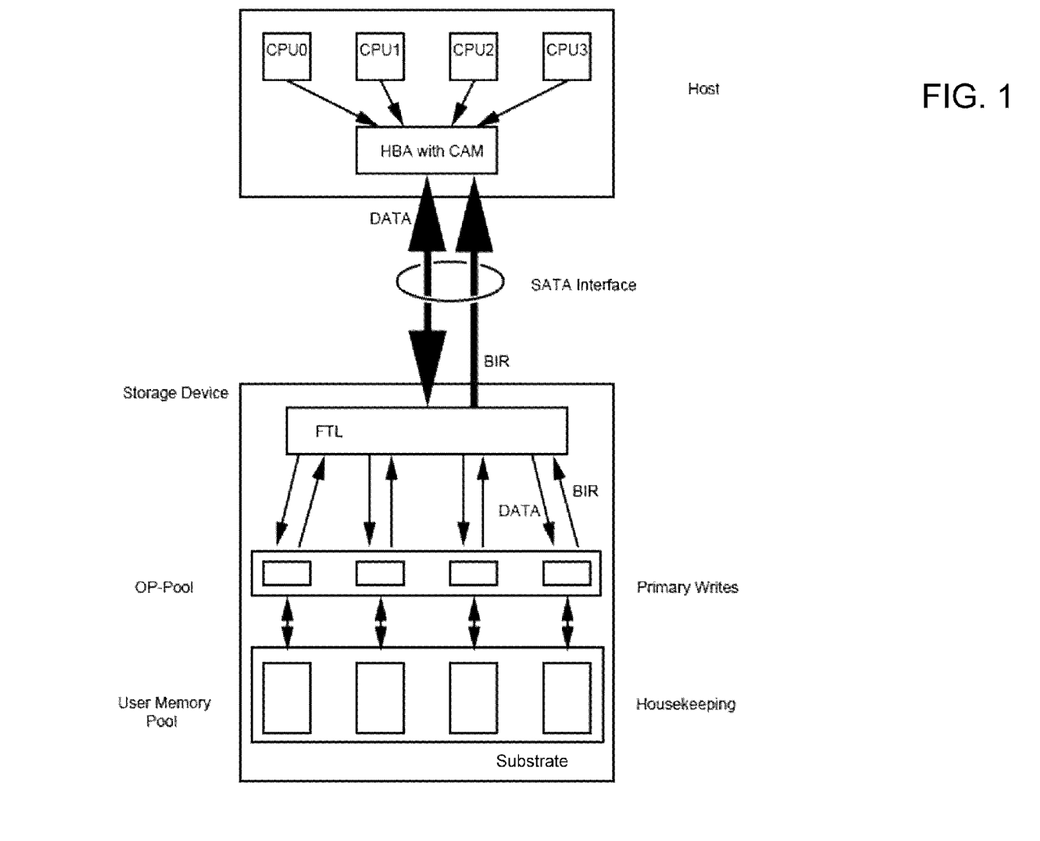
FIG. 1 schematically represents an exemplary embodiment of the invention using a SATA interface.

FIG. 1 schematically represents a relatively uncomplicated form of the invention, in which a mass storage device comprises non-volatile solid state memory components, for example, NAND flash memory components (IC chips), that are mounted on a substrate, along with a flash translation layer (FTL). The memory components are arranged in what are termed an "OP-pool" and a "User Memory Pool," to be described below. FIG. 1 represents a system that enables the memory components to be accessed through a single, high-speed interface (connector), similar or identical to serial ATA interfaces currently employed with SATA HDDs and SSDs. At the current state of technology, the access latencies and bandwidth restrictions of NAND flash memory technology can impose a sufficient bottleneck to allow this kind of system interface to work without constituting a severe limitation.

Figure 2:
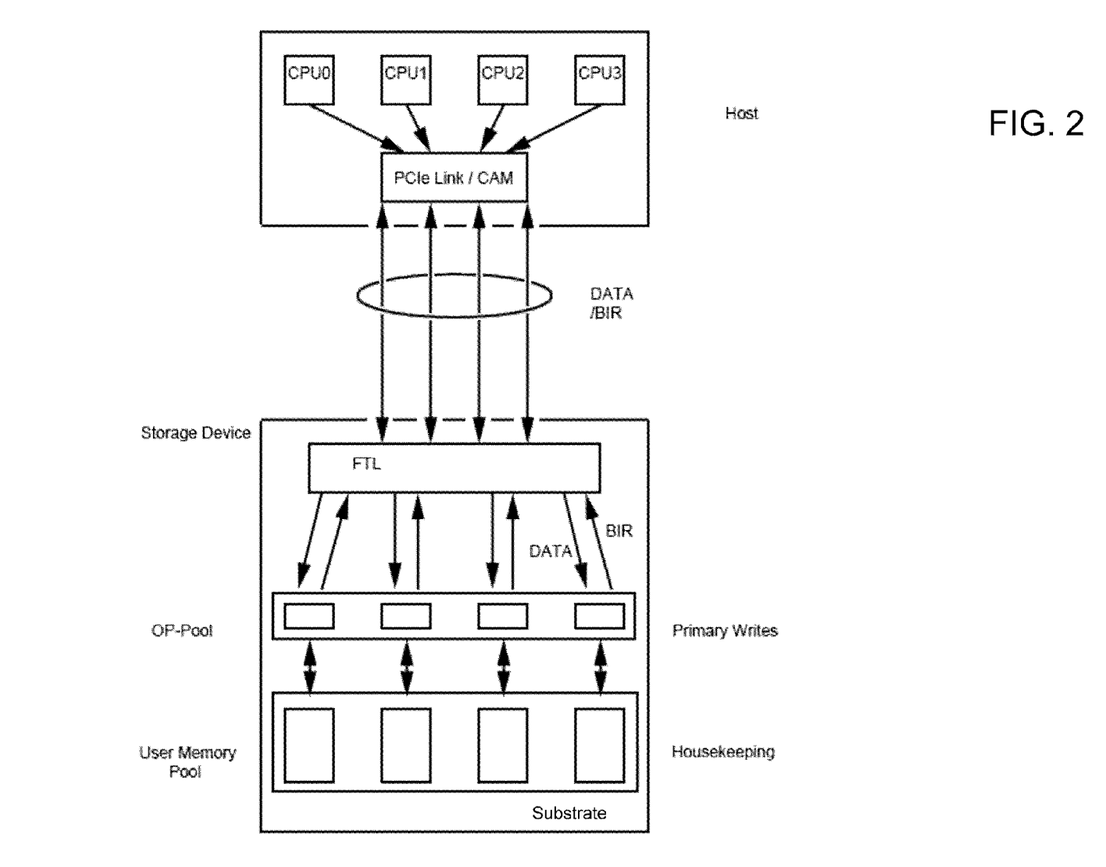
FIG. 2 schematically represents an implementation of the invention using a PCIe interface.

A different aspect of the invention is shown in FIG. 2, which is similar to the embodiment of FIG. 1, but uses a unified, wide interface, for example, a multi-lane PCIe link, that satisfies the bandwidth requirements and does not lead to bus contention, a problem that can be mitigated by implementing read-around-write and/or write combine buffers on the host system. Typically, the bus directly talks to a NAND flash controller but it is also possible to have additional logic, such as in the form of a PCIe-based SATA HBA and a SATA controller interposed between the host and the FTL. For simplicity reasons the drawing shows only one arrow for each pair of upstream and downstream connection but it is understood that in most cases a full duplex implementation of two sets of differential pairs constitute each lane.

Figure 3:
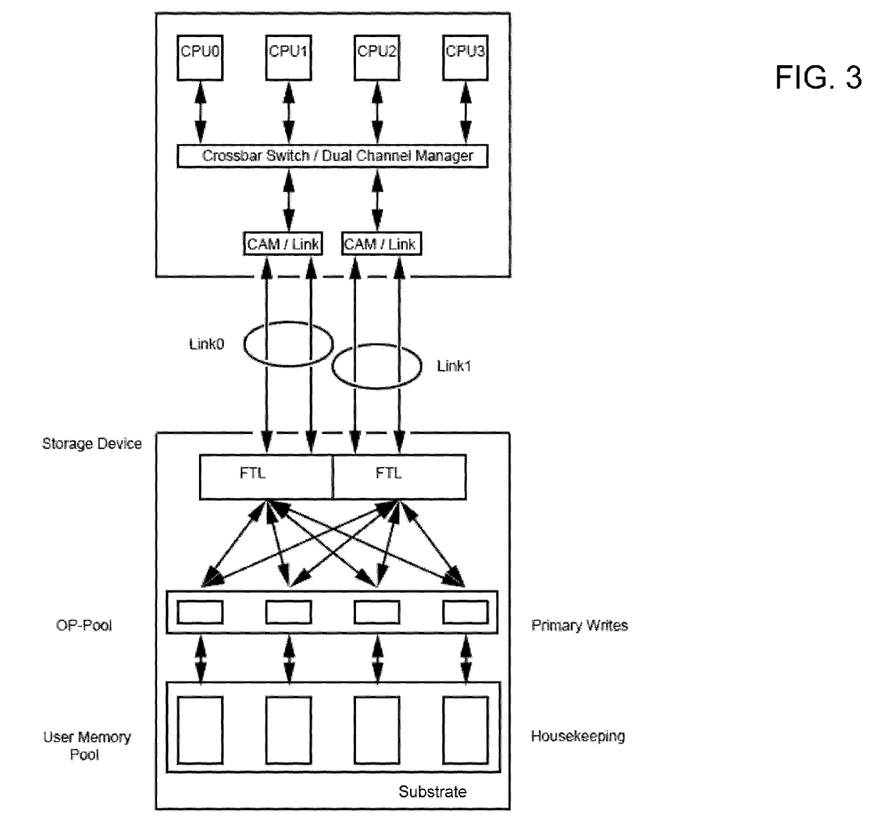
FIG. 3 schematically represents an implementation of the invention using a dual independent link interface with two file translation layers accessing a unified flash memory space, wherein each link is accessible by each CPU or thread via a crossbar switch/memory channel manager.
Figure 4:
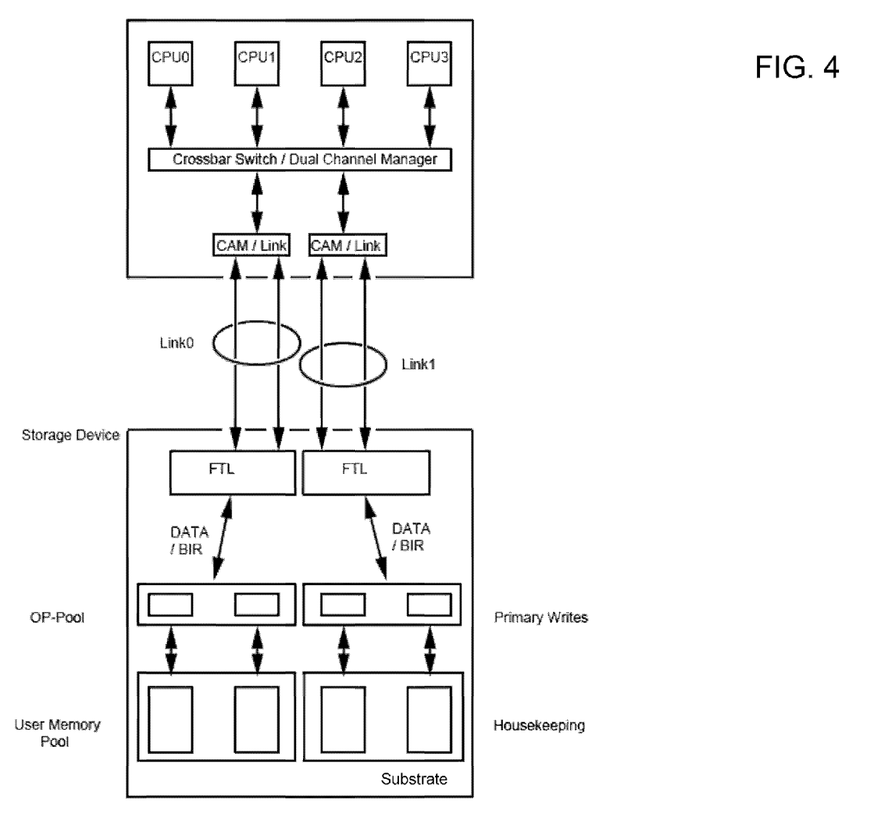
FIG. 4 schematically represents an implementation of the invention using a dual independent link interface with each link serving its own flash memory domain, wherein each link is accessible by each CPU or thread via a crossbar switch/memory channel manager.

A more advanced aspect of the invention shown in FIG. 3, which again shares common features with the embodiments of FIGS. 1 and 2, but directly exposes NAND flash memory components through a distributed append interface to the operating system. Rather than creating a pseudo-contiguous physical file structure first, which is then queued up and transmitted over the serial interface before the data are broken up again and distributed over parallel channels, each file or composite sequence of small files is immediately distributed into chunks matching the physical mapping units of the NAND flash memory components. The system interface contains parallel lanes, for example, as used in PCIe or Hyper-Transport to allow multiple threads to access the storage device in a substantially concurrent manner, wherein the FTL acts as the functional equivalent of a crossbar-switch. Alternatively, as shown In FIG. 4, the non-volatile memory space defined by the NAND flash memory components can be split into several physical domains with each domain having its own access channel similar to the dual or triple channel system memory configuration used in current x86 architecture. The distribution of the workload over the individual channels is done on the level of the host system, but every thread can access each channel.

The current PCIe specifications allow for functional segmentation of the lanes going into a single PCIe expansion slot into two distinct groups, wherein each group interconnects the system with its own target device as an optional feature. For example, a single PCIe expansion card with eight lanes could have a graphics adapter in addition to a host bus adapter with each negotiating four lanes from the host. However, in practice this feature is hardly implemented on the host. Instead, all lanes of any given PCIe slot typically have to interface with a single peripheral device. A full utilization of the benefits of the proposed file system will, however, greatly benefit from fully independent links, wherein each link may have multiple, full duplex lanes within a single physical interface that can be accessed in parallel by the individual threads on the system level. The number of independent links can vary as long as more than one link is established.

B. Over-Provisioning Pool for Host Writes

Regardless of the interface used, on a host write, the data are transferred through the transmit (write) link of the host bus adapter to the FTL on the storage device while the receive (read) link of the interface receives updated block information records (BIR) from the FTL. All data are written initially to blocks virtually assigned to the over-provisioning pool (OP-pool) using the P/E count of blocks as primary address (see below for details). A volatile memory buffer, which can also be part of the system memory, may be used as intermediate cache. Once all pages of the block are filled with host writes, the block is virtually moved into the user memory pool whereupon the OP-pool is replenished by another free block from the user memory pool based on its P/E cycle count. Read accesses by the host access the data from the user memory unless the block containing the data is still part of the OP-pool since it is only partially written. It is also possible to move any block from the OP-pool to the user memory space after a write access is completed and then to reclaim space through garbage collection within the user memory pool. This method may simplify read accesses of NAND flash memory components.

C. Mapping Units in a Multidimensional Address Space

A mapping unit is a physical structure associated with a logical block address, for example, a sector on a hard disk drive. In the context of the invention, a mapping unit can be an entire NAND flash page or a fraction thereof. Non-limiting examples are 4 kByte or 8 kByte-sized mapping units. Also, according to the invention, a heterogeneous mixture of different mapping unit sizes is possible through on-the-fly specification of blocks on demand as having one or the other size. In most current applications and operating systems the majority of writes are 4 kB which typically make up approximately 70% of all writes to the storage media, followed by 8 kB writes that typically constitute roughly 20% of all writes. All other file sizes, including runts from 0.5-3.5 kB as well as files larger than 8 kB, typically make up approximately 10% of all writes. Accordingly, it appears sufficient to limit the support of mapping unit sizes to 4 kBytes and 8 kBytes using distinct identifiers for each pool. Mapping unit size can be assigned on demand for each block within the OP-pool. That is, the blocks in the OP-pool are in erased state anyway and the assignment of the mapping unit size is equivalent to a "quick format" on the block level that can be done to best match the incoming data structure.

Figure 5:
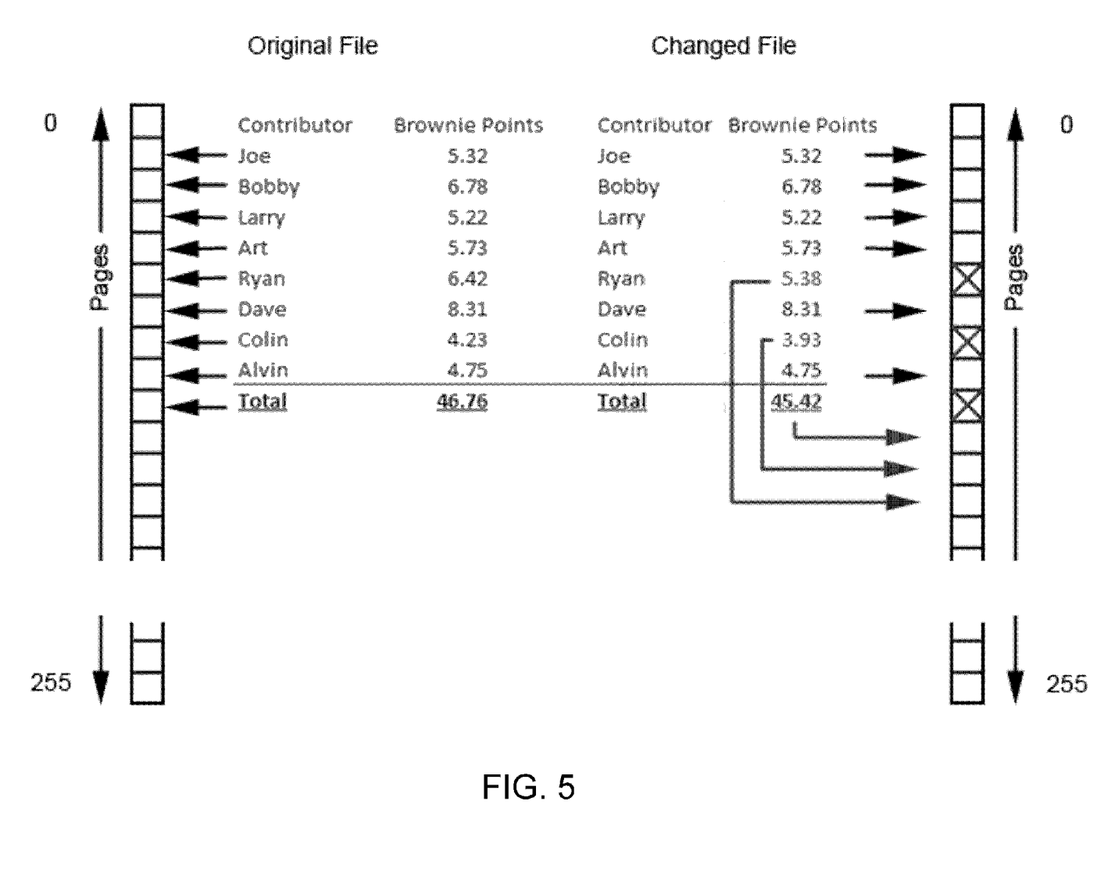
FIG. 5 shows a flow diagram of a file change using the P/E count of the BIR as primary address, including space reclamation and optional version control.

Larger mapping units can also be supported. In view of the trend to increase flash memory page sizes to 16 kB and possibly 32 kB or beyond, there is no reason to limit the number of available pools to the above discussed 4 kB and 8 kB sizes. A side effect of using mapping units that match the size of the majority of written files allows treating files as objects rather than strings of physical sectors which can also simplify file management. Files of a size in excess of the largest available mapping units can be treated as composite objects, which also allows for targeted updates of partial files without rewriting data that have not changed. An example is shown in FIG. 5, where a table from a spread sheet spanning over several pages is updated by appending the changed entries only to new pages.

D. Next-in-Line Addressing of Blocks

The following discussion of the next-in-line address generation applies in principle to all physical configurations discussed above, including the single link SATA interface or the unified wide PCIe interface. In preferred embodiments, NAND flash memory is exposed directly to a parallel access path in real time while strictly using append mode. The memory space forms a multi-dimensional matrix based on channel, chip, block and page dimensions with P/E cycles as the first dimension for block selection for write access in "next in line" append mode. An overview is provided by a process flow chart in FIG. 6.

In more detail, since the virtual mapping of addresses makes the actual physical address of free blocks inconsequential, and the flash translation layer assigns physical addresses to the logical addresses of the host file system, physical contiguity of data is no longer required. Rather, it is important to assure that each block is subjected to a similar wear. This type of wear-leveling can be accomplished by using the block information record (BIR) to keep track of program/erase (P/E) cycles of each block as well as the block's status with respect to being free, valid, or obsolete, and to enable P/E cycle-based sorting to map or assign the "next in line" parameter to the pool of NAND flash blocks with the lowest erase count. For a new SSD, P/E cycle monitoring is not important since all blocks start at substantially zero P/E cycles. However, after reaching steady state, P/E cycle-based block management becomes import. As a first step, blocks are erased as a part of space reclamation and blocks with a P/E count below average are scheduled to replenish blocks from the OP-pool as soon as the latter are written to by the host.

Figure 7:
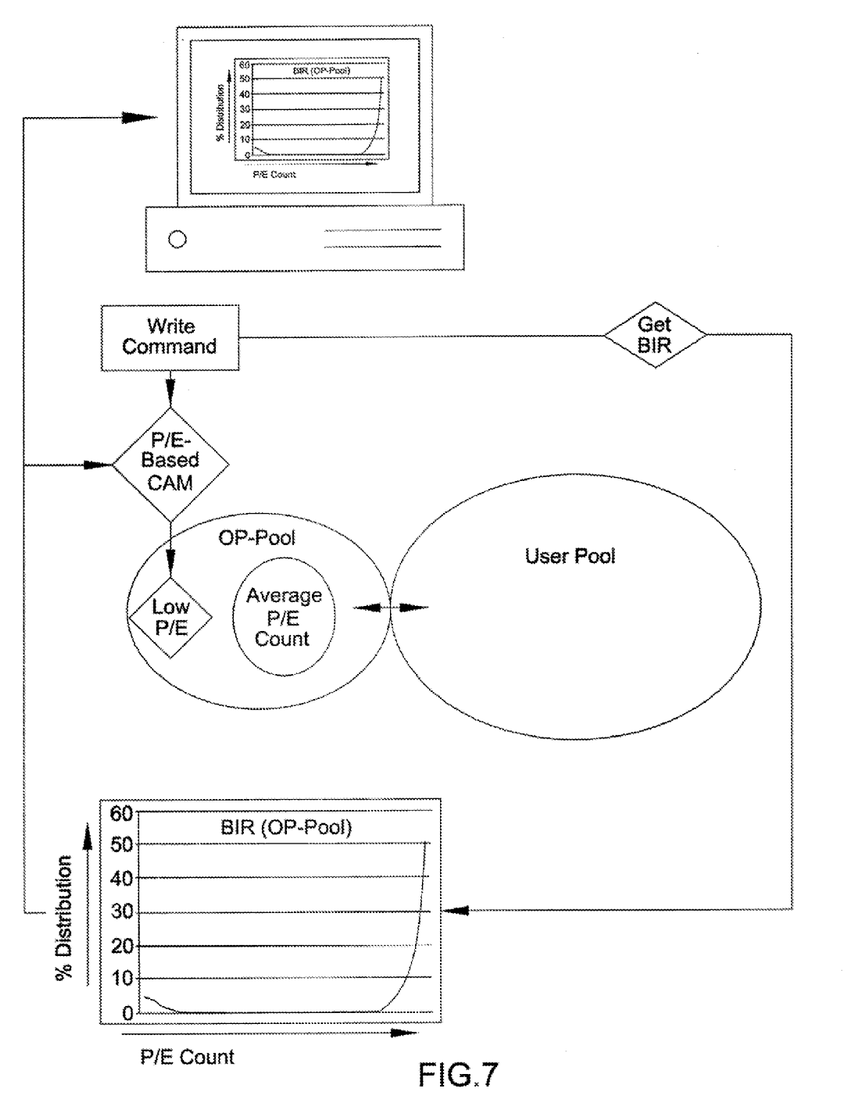
FIG. 7 shows in more detail the sequence of block selection from the OP-Pool by getting the latest BIRs from all blocks in the OP pool and selecting the one with the lowest P/E cycle for the write access.
Figure 8:
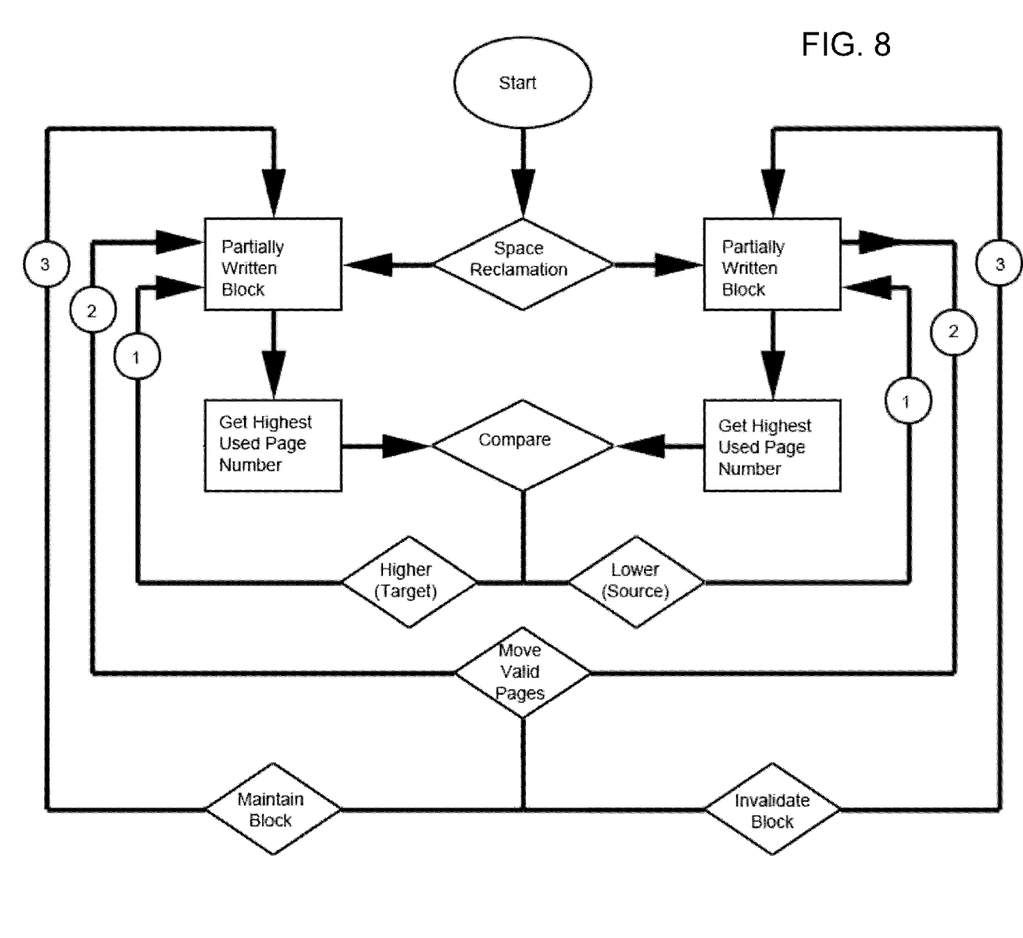
FIG. 8 shows a partial file update using the example of a spread sheet/data base entry wherein only the updated values are written to new pages that can be in the same block or in a different block.

Within the OP-pool, most blocks have a similar P/E count. However, there is typically also a fraction of blocks with a lower P/E count, originating from refresh of infrequently accessed files. That is, blocks containing files that are not changed are still rewritten after housekeeping of the drive determines deterioration of data integrity as a consequence of stress-induced leakage current, read disturb or other factors impacting data retention. However, those blocks will typically have a lower P/E count than the bulk of blocks and once they are refreshed, that is, the data are rewritten to other blocks and the first blocks are cycled back into the OP-pool, the OP-pool will show a bimodal distribution of P/E cycles with the majority of blocks at a somewhat higher P/E count and a minority at a lower P/E count, as shown in FIG. 7.

One aspect of the invention uses a content addressable memory (CAM) buffer, which stores the BIR of all physical block addresses and uses the P/E count as dynamic address range to generate the block addresses. The CAM can be hardware-based, for example in the form of a translation lookaside buffer, a circular buffer or constitute a software-based look-up table. The physical block addresses may be translated through the flash translation layer into logical addresses. The P/E cycle count of all NAND flash blocks of the storage device can be updated in real time and forwarded to a log accessible by the file system. Blocks entered into the OP-pool have a lower P/E count than average; therefore it is possible to set a threshold for accessing only blocks in the OP-pool based on the P/E count by issuing a P/E number below the P/E threshold at which blocks are entered into the OP-pool. In a streamlined version, the storage device does a pre-selection of blocks that are entered into the OP-pool based on the P/E count and only the P/E count of blocks assigned to the OP-pool is visible to the file system. The file system may display the P/E count to the user in any conceivable format including a numerical listing, a histogram of all blocks of the device, or a histogram of the OP-pool, for example, of a type represented in FIG. 7. In addition, the system may store the changes in the BIR in a log file. For example, in one embodiment the log file is written back to the drive of origin in order to associate the log file directly with the device. However, another embodiment is to change the path for the log file with the added benefit of being able to access the file in case of a catastrophic failure. Both methods are not mutually exclusive, rather, the log can be stored on the device of origin and then shadowed on a separate device. In addition, the log can be stored with different levels of granularity in the different versions. For example, the drive itself may contain a relatively simple log, similar to what is currently used for SMART attributes, whereas the host stores a more complex log containing the detailed transaction history including transfer size, random or sequential transfers, write amplification and time stamp for each block access to allow analysis of the complete history of write and read accesses of each block. This type of data allows a snapshot of the drive usage at any given moment during its usage, which can yield important data regarding usage patterns and their relation to reliability of the drive or its failure.

The file system then uses a composite address in which the P/E count is the first dimension for any write access. If the lowest P/E count number is given as primary address for a write request to the CAM, the CAM will return the primary available address space in the form of a multi-dimensional matrix of all blocks with the same P/E count which can be distributed over all memory components in all channels of the solid state drive. A certain degree of freedom can be implemented by using a ternary CAM in order to eliminate stalling of write transactions at the end of the primary address space by allowing for transition across a range of P/E cycles. A ternary CAM has a "don't care" option to allow a bit of flexibility. This way, if the drive runs out of blocks with a single P/E cycle count, it can transition to the next number.

The above discussed append mode of storage can be performed if the memory space is not completely filled up. In other words, a prerequisite for append mode is the availability of free or unused blocks, in which case the memory space is preferably partitioned into a user accessible pool (user memory pool) and a pool of spare blocks in the form of the OP-pool, which always contains un-used blocks. Blocks are dynamically assigned to either pool from where they can be cycled in and out. Data are always written to the OP-pool and as soon as a block is full it will be cycled into the user memory whereupon a free block is virtually assigned to the OP-pool in order to replenish it.

In most cases, it will be advantageous to give the P/E cycle count first to select the pool of "next in line" blocks and then determine the most efficient physical distribution of addresses based on channel utilization and similar parameters. However, it is also possible to use a composite address with several fields to speculatively predetermine the access pattern. For example, a P/E number can be used in combination with a channel identifier for predetermination of optimal distribution of a larger file across all available NAND flash channels and the same principle can be applied to the chip (enable) address for power/thermal distribution and interleaving purposes.

In the case of the address generation using multiplexing, that is, using the P/E count first and then selecting the secondary address dimensions as channel, chip, block and page, the exact location for the append-write within the pool of blocks with the same erase count can be chosen based on a variety of parameters including chip enable, strobe position for block and page selection.

E. Dynamic Change Between SLC and MLC Mode

Another aspect of the invention is to carry out host writes in SLC mode after the primary selection of available blocks in the OP pool based on P/E count. In more detail, in order to use the MLC functionality available with NAND flash memory components, the cells are programmed in two steps. The first pass programs the upper bit up to a first voltage threshold of the entire voltage distribution, which is a fast, coarse programming cycle and which is essentially the same as SLC programming. The second bit is programmed as an additional pass of "fine tuning" and, by convention, constitutes a separate logical page. Because of the different granularity or precision of the required programming, typically a larger string of data is programmed into a sequence of "upper" pages first.

Once the predetermined number of upper pages in the logical sequence of page numbers has reached its boundary, the address strobes are looped back to access the same cells with the "fine-tuned" programming voltage to generate the complementary lower pages in the same physical cells containing the upper pages programmed in the initial "coarse" step.

Because of the higher precision required, the second programming and verification steps are considerably slower and still prone to a higher error rate than the first step. Consequently, for optimal performance, and if the pattern of upper vs. lower pages is known, it is possible to only program the cells in SLC mode. Arguably, this mode may sacrifice half of the total capacity of the blocks since only half of the logical pages are programmed. However, this mode is limited to host writes to the OP-pool. As soon as the blocks are virtually assigned to the user memory, the blocks can be switched to MLC operability and the skipped pages can be reclaimed through garbage collection and data coalescence. In other words, host writes are done in SLC mode whereas housekeeping writes are performed in MLC mode. This dual mode programming scheme greatly improves the overall performance of the storage device with minimal impact on capacity. Technically, instead of skipping the page addresses for the lower pages when operating in SLC mode, a pseudo SLC mode can be used in which the lower pages are simply programmed to erased or "don't care" state, meaning that no actual programming step is performed. As long as the file system keeps track of where the valid data are, any programming or lack thereof of invalid pages remains invisible to the file system.

After each erase process of a block, which allows the block to be cycled into either the user or OP-pool, the mode of programmability to either SLC or MLC can be assigned on a block level and only SLC blocks can be virtually moved into the OP-pool, whereas MLC-configured blocks can be used for garbage collection and data coalescence.

Another possibility is to use load-dependent differential access speed and/or error correction for upper and lower pages in an MLC-NAND flash-based space. That is, the overall transfer rate between the host and the storage device can be monitored and during periods of low bandwidth utilization, slower pages or pages with higher error correction requirements may be used whereas during periods of high bandwidth usage, the NAND flash blocks may be written to in SLC mode and the lower or MLC pages may be reclaimed during garbage collection.

F. Reclamation of Space

After a host write has filled up the available pages of a "next-in-line" block in the OP-pool, the block is virtually moved into the user memory pool space, as represented in FIG. 7. Since files are not overwritten but appended to a new location, this leaves the original pages with invalid data. Before these pages can be rewritten, they need to be erased, which can only be done on a per block basis. In order to erase a block, it needs to be purged of all valid data through housekeeping mechanisms that collect valid data and coalesce them within a single block. This is of particular importance in the case of the dynamic SLC-MLC mode discussed above.

Figure 6:
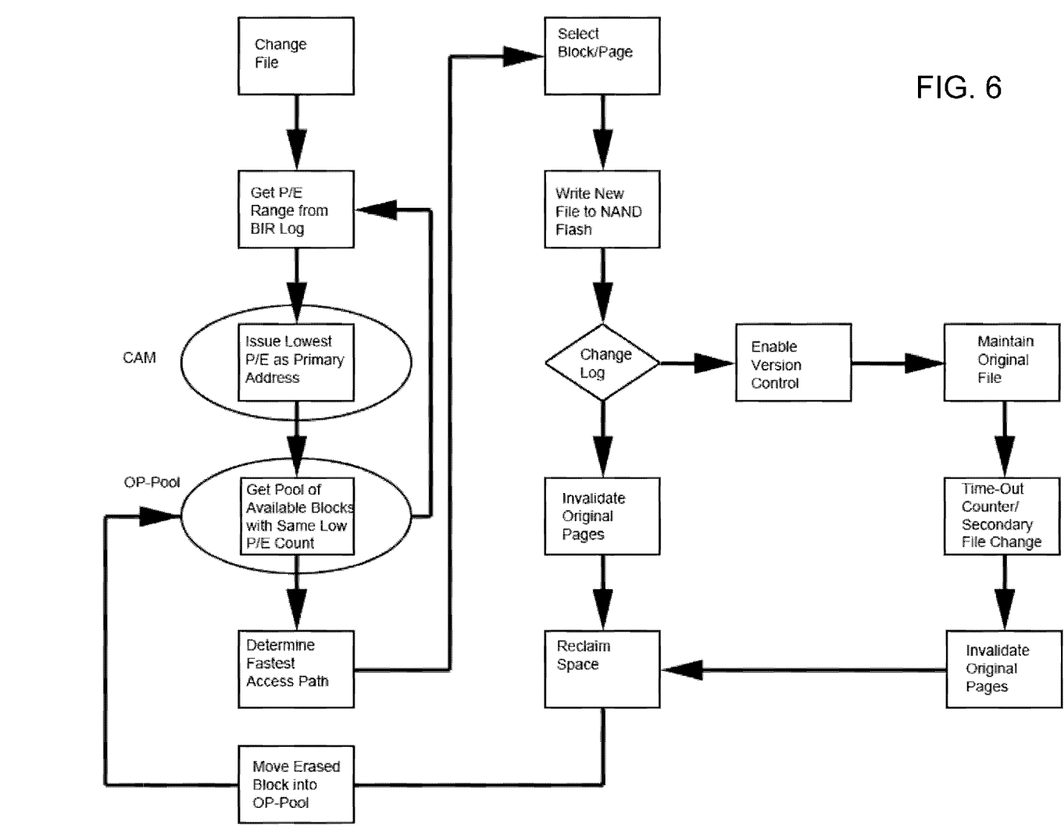
FIG. 6 shows a flow diagram of space reclamation based on highest page number in use comparison of blocks to determine source and target with the sequence of events given as (1), (2), (3).

Blocks containing data that are invalid or obsolete to the file system (including those programmed by host writes in SLC mode) are proactively erased on the level of the device. Before the block can be erased, all valid data need to be moved into another block. Typically, valid pages are read into the page buffer and (optionally) into the controller and subsequently written back to a free block using sequential page numbers. FIG. 6 illustrates an optimized routine in which the source vs. target block is selected based on the highest used page number associated with valid data. In short, one possibility uses the combining of data from partially programmed blocks and selects the blocks with the lowest number of valid pages as source and the blocks with higher numbers of valid pages as target for data coalescence in order to minimize traffic. The second possibility is to read out all valid pages from at least two blocks and write them back to a fresh, third block.

Bulk erase of the obsolescent block can be initiated through a host command like TRIM or autonomously on the level of the drive. In short, the file system has a snapshot of valid logical block addresses that can then be compared against the metadata on the drive. Blocks identified as containing obsolete data only (since no pointer is associated with them) are then scheduled for bulk erase whenever the erase process interferes least with the activity of the drive, for example, during idle periods. The bulk-erase process can be triggered by the host system or become part of house-keeping functions of the storage device that are autonomously carried out without host interference.

Additional options of the house-keeping functions of the drive can entail surface scrubbing for bit error rate monitoring and coalescence of partially valid blocks.

G. Version Control

In a slightly modified aspect of the file system discussed above, it is also possible to introduce version control on the level of the file system, as shown in FIG. 6. Since data are not overwritten but appended to the "next in line" block, the previous version will always be available, at least until its block is marked for bulk-erase. The only requirement for this type of version control is an additional flag that can be implemented on the level of the metadata for correct identification of the last, second to last, etc., version. Version control does not need to be limited to a single previous version. Instead, the number of available levels can be specified either globally, that is, on the level of the OS or file system, or application-specific. In addition to levels of version control, a time-out interval can be specified after which the last version is automatically unprotected.

For example, in documents such as Word or Excel files that use an auto-save function, it is possible to maintain the last two or three versions in parallel. The same applies for graphic art such as Adobe Photoshop files, included here as a non-limiting example. Especially in the case of data base applications, this type of version control may be an invaluable asset since it allows setting restore points for files similar to volume shadow copies used as system restore points in Microsoft Windows operating systems. In addition to using numbers of versions, it is also possible to use the time stamp of the appended new file to initiate purging and permanent erasure of the previous version after exceeding a time threshold. This could be particularly beneficial in the case of hierarchical storage management with heterogeneous storage media and the use more than a single file system.

Version control can be implemented either transparent to the user or in a user-visible mode. In the latter case, the previous versions of files may show in a virtual back-up directory tree, mirroring the original volume letters and directories. Once a file is saved again, the up-to-that-moment current version is virtually moved into the back-up pool and the freshly saved copy becomes the original version.

If a user-transparent mode is selected, the version control acts more like a conventional recycling bin that is accessed through a restore command. Otherwise, the shuffling of versions in and out of the recycling bin uses the same log-structured approach described above. Depending on the levels of version control desired, the level of over-provisioning would be adjusted since multiple copies of the same file are carried over.

H. File Coherency in Multithreaded Systems

A parallel file system can only play out its strength in systems using thread level parallelism. Specifically, multiple processors or cores, including virtual cores, can simultaneously access the storage medium, for example, a NAND flash-based SSD, similar to a SCSI Multi-initiator-Multi-Target matrix. One inherent problem with this kind of approach is file coherency, similar as in distributed shared memory systems. If two processors or threads access the same file and modify it independent of each other, the second thread will negate the changes made by the first since it retrieved the file before the first thread wrote back its modifications to the storage device.

Preventive measures against incoherency can use bus snooping to tell the system whether the file is valid, shared or dirty. If a file is modified and then written back to the storage device by one of the processors through automatic snarling, all other copies in use by other processors can be automatically flagged as invalid and the processors will need to retrieve the most current copy. This type of bus snooping/snarling works well in relatively small memory spaces, however, in the case of parallel file systems, a different approach through a directory-based coherency protocol may be much more efficient.

Briefly, directory based coherence can be established by creating a coherency directory into which all data that are shared between multiple processors are placed. In the case of the proposed parallel file system, all data that are accessed are simply linked to a virtual coherency directory. The directory can also contain file handles, that is, a value assigned by the drive or its firmware to any file that is opened by a thread. The handle can also contain additional information such as classification of a file as read only and similar flags. The presence of a handle on a file then signals to all other threads trying to access the file that the file is already in use and any adaptation of existing cache coherency protocols such as MESI (modified, exclusive, shared invalid), MOESI (modified, owned exclusive, shared, invalid) or similar can be applied. As soon as the file is written back to the storage device, the directory entry is purged. Alternatively, any other file coherency protocol can be applied to avoid version conflicts.

I. Coherency Directory Prerequisites

The coherency directory logs metadata of files in use at any time. The log is constantly updated, which means, it is subjected to an extremely high write activity. For the obvious reasons of endurance and pre-erase requirements, it is not practical to use media like NAND flash memory components and keep the coherency directory on the device level. Rather, the coherency directory is preferably created within the system memory, which further has the advantage of ultra-low access latency from either processor or thread. The use of volatile memory in conjunction with storage media always bears the inherent risk of data loss upon power failure, which can be addressed by using a secondary log in form of a journaling memory on the device level. This kind of journaling memory can be any non-volatile memory with extremely high write endurance like MRAM, nVSRAM or FRAM.

J. New Commands

A multidimensional address space-based storage system will abide by different rules than a contiguous sector-based storage system. The SATA protocol-based first party DMA access may still be used in order to let the storage device set up its own DMA channel instead of relying on system polling. This allows for efficient read-caching of the information from the different pages and blocks over which the requested files are distributed and then bursting the data out to the bus using minimal transaction cycles. However, it may be of interest to implement new commands, which could be the same or functionally equivalent to those listed below:

[getBIR]: accesses the block information record including erase cycle count and status
[setLevelNumber]: sets the number of levels maintained for version control
[getLastCopy]: retrieves the latest version of a file (default)
[getLevel#Copy]: retrieves a specified version of a file
[updateLocalCopies]: broadcasts information of file update to all threads accessing the thread While certain components have been shown and described as preferred for the non-volatile memory-based file system and mass storage devices of this invention, it is foreseeable that functionally-equivalent components and addressing schemes could be used or subsequently developed to perform the intended functions of the disclosed invention. For example, future non-volatile memory technologies may supersede NAND flash memory components, while their write endurance might still be limited to a certain number of erase or programming cycles. Also, host interface technology may change from the SATA or PCIe technology described here as a non-limiting example. In addition, storage devices may be developed that are capable of running their own file systems on-device or conform to an integrated file server, wherein all aspects discussed above are implemented on the level of the storage device itself which functions as a sub-host. Therefore, while the invention has been described in terms of preferred embodiments and aspects, it is apparent that other forms could be adopted by one skilled in the art and the scope of the invention is to be limited only by the following claims.

The invention claimed is:

1. A NAND flash-based mass storage device, the storage device comprising:
    a substrate;
    at least two NAND flash memory components on the substrate, the memory components defining a NAND flash memory space organized into blocks and pages, each block having a block information record storing the number of program and erase cycles of the block;
    a NAND flash controller including a flash translation layer, the flash translation layer translating logical block addresses into physical block addresses; and
    an interface that interfaces the storage device with a host system through a system interface;
    wherein the storage device sends the block information record of at least some blocks to the host, the host stores the block information record of the program and erase cycles in a content addressable memory, the content addressable memory associates the logical address of the block with the number of program and erase cycles and the flash translation layer translating the logical address to a physical block address, and, on writing data to the storage device, the host selects a number of program and erase cycles to obtain a logical block address from the content addressable memory the file translation layer translating the logical address into a physical address of a block to which the data are written.

2. The storage device of claim 1, wherein the content addressable memory is a ternary content addressable memory.

3. The storage device of claim 1, wherein the content addressable memory is a look-up table.

4. The storage device of claim 1, wherein the content addressable memory is a translation lookaside buffer.

5. The storage device of claim 1, wherein the interface conforms to the SATA standard.

6. The storage device of claim 1, wherein the interface is a multi-lane PCIe interface.

7. The storage device of claim 1, wherein the interface comprises at least two independent links connected to a multi-ported flash translation layer that acts as crossbar switch for addressing blocks in a unified NAND flash memory pool.

8. The storage device of claim 1, wherein the interface comprises at least two independent links and wherein each link connects to its own NAND flash memory domain and link-selection by individual threads is done on the level of the host.

9. A method of operating the storage device of claim 1, the method comprising monitoring the program and erase count of all blocks, partitioning the NAND flash memory space into a user memory pool and an over-provisioning pool, and assigning one or more blocks with the lowest program and erase count after an erase cycle to the over-provisioning pool.

10. The method of claim 9, wherein blocks assigned to the over-provisioning pool are written to in single level cell mode, the majority of blocks in the user memory pool are configured in multilevel cell mode, and space reclamation uses multi-level cell mode blocks for coalescence of valid data.

11. The method of claim 9, wherein blocks assigned to the over-provisioning pool are formatted to one of a plurality of mapping unit sizes.

12. The method of claim 9, wherein some files are stored in a mapping unit and treated as a single object by the file system, and other files are stored in a plurality of mapping units and treated as composite objects.

13. The method of claim 9, wherein files changed by the host are stored as partial updates changed parts of the files are stored in a new physical location, and metadata are updated to point to the new physical location of the partial update.

14. The method of claim 9 wherein, after an original file is updated, the original file is not invalidated but assigned a version control level.

* * * * *